United States Patent
Schultz

(10) Patent No.: US 8,397,184 B2
(45) Date of Patent: Mar. 12, 2013

(54) CHANNEL LENGTH SCALING FOR FOOTPRINT COMPATIBLE DIGITAL LIBRARY CELL DESIGN

(75) Inventor: Richard Schultz, Fort Collins, CO (US)

(73) Assignee: LSI Corporation, San Jose, CA (US)

(*) Notice: Subject to any disclaimer, the term of this patent is extended or adjusted under 35 U.S.C. 154(b) by 492 days.

(21) Appl. No.: 12/248,677

(22) Filed: Oct. 9, 2008

(65) Prior Publication Data

US 2010/0095252 A1 Apr. 15, 2010

(51) Int. Cl.
*G06F 17/50* (2006.01)
*G06F 9/455* (2006.01)

(52) U.S. Cl. ........................................ 716/100; 716/132

(58) Field of Classification Search .................. 716/100, 716/132

See application file for complete search history.

(56) References Cited

U.S. PATENT DOCUMENTS

| | | | |
|---|---|---|---|
| 5,719,421 A * | 2/1998 | Hutter et al. .................. | 257/335 |
| 7,185,294 B2 * | 2/2007 | Zhang ............................. | 716/55 |
| 7,716,612 B1 * | 5/2010 | Gupta et al. .................. | 716/132 |
| 7,867,698 B2 * | 1/2011 | Chua et al. ..................... | 430/394 |
| 2005/0278660 A1 * | 12/2005 | Zhang et al. ...................... | 716/2 |
| 2006/0064665 A1 * | 3/2006 | Zhang ............................. | 716/17 |
| 2007/0122961 A1 * | 5/2007 | Zhu et al. ....................... | 438/199 |
| 2008/0010626 A1 * | 1/2008 | Correale .......................... | 716/17 |
| 2009/0019413 A1 * | 1/2009 | Kobayashi ........................ | 716/9 |
| 2009/0083688 A1 * | 3/2009 | Moroz et al. .................... | 716/11 |
| 2009/0286167 A1 * | 11/2009 | Tan et al. ........................ | 430/5 |
| 2010/0058267 A1 * | 3/2010 | Lu et al. .......................... | 716/9 |
| 2010/0077371 A1 * | 3/2010 | Kobayashi ....................... | 716/8 |
| 2011/0252392 A1 * | 10/2011 | Saika ............................. | 716/119 |

* cited by examiner

*Primary Examiner* — Thuan Do
*Assistant Examiner* — Magid Dimyan
(74) *Attorney, Agent, or Firm* — Clark Hill PLC

(57) ABSTRACT

A library cell is designed, and then the width of the polys is increased, and the polys and contacts are shifted in order to maintain poly-to-poly and contact-to-poly spacing. The method can be used in association with a 45 nm digital library cell. Specifically, a library cell having 40 nm polys is designed, and then the width of each of the polys is increased by 5 nm to 45 nm, and the polys and contacts are shifted in order to maintain poly-to-poly and contact-to-poly spacing. The poly lines and contacts can be shifted by starting at the center and going out radially, or by beginning at the perimeter and moving radially inward. The method can be used with any library cell design which is entirely GDS based, including, for example, 32 nm library cell design.

9 Claims, 11 Drawing Sheets

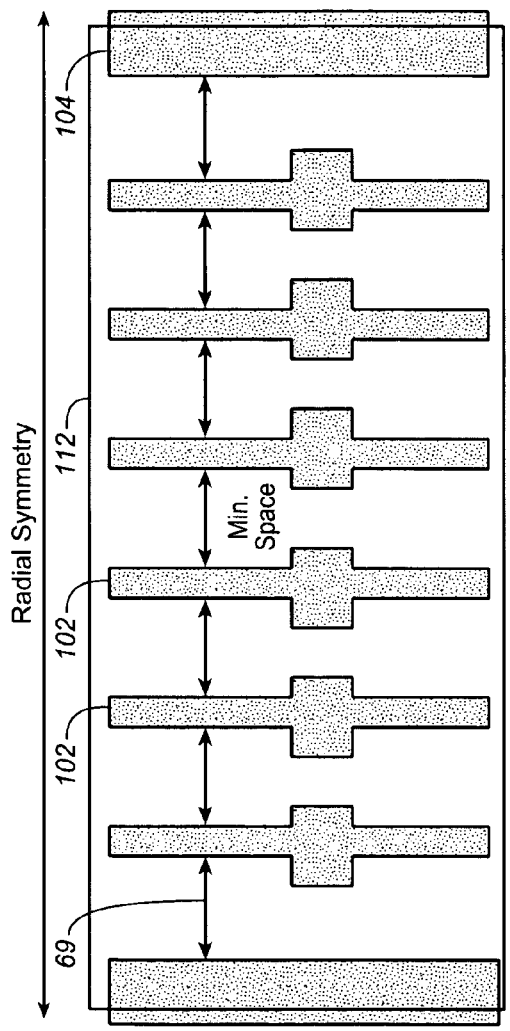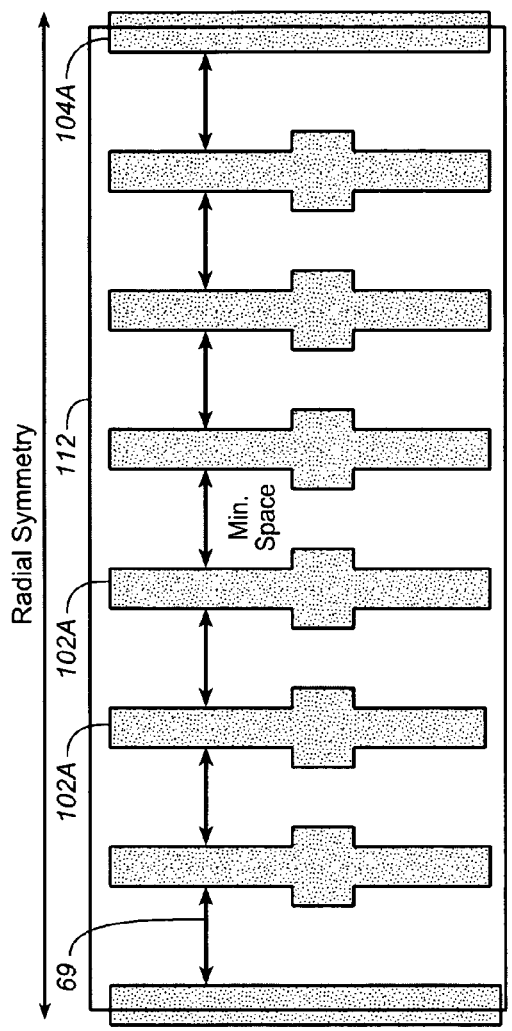

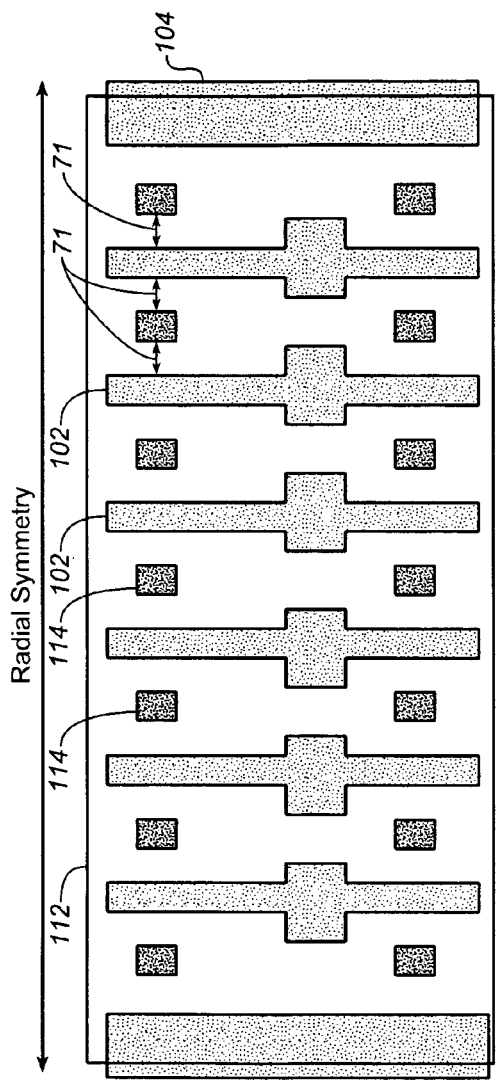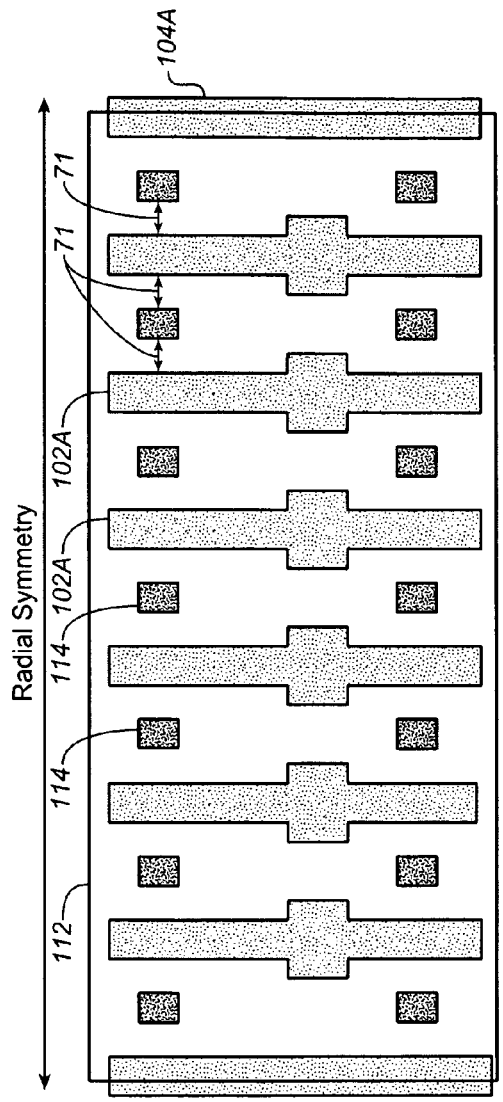
FIG. 9A
FIG. 9B

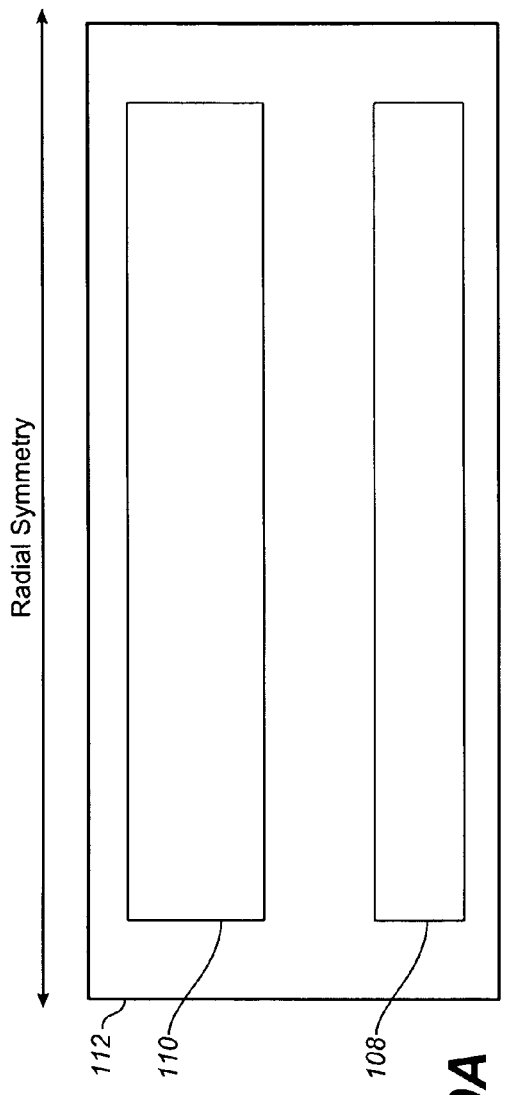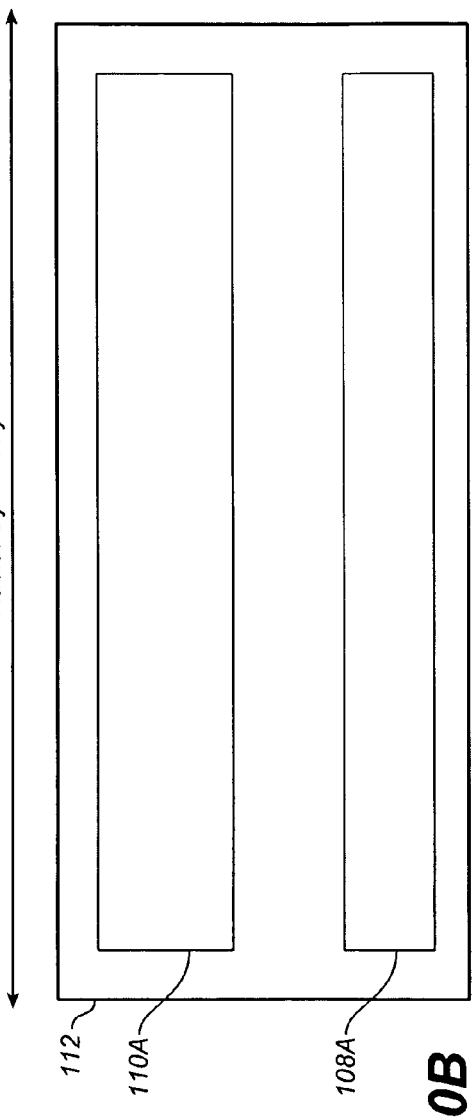

US 8,397,184 B2

CHANNEL LENGTH SCALING FOR FOOTPRINT COMPATIBLE DIGITAL LIBRARY CELL DESIGN

BACKGROUND

Within a digital library cell, channel length scaling can be achieved by increasing the size of the poly. For example, a portion of a 65 nm library cell 10 is illustrated in FIG. 1. The library cell 10 is provided on a 5 nm GDS grid 12 and includes a poly element 14 and two contact elements 15. Channel length scaling is achieved by providing 5 nm of additional poly elements 16 to both sides of the poly element 14, thereby increasing the size of the poly by 10 nm. This increase in size results in channel length scaling of approximately 17%. By adding poly elements 16 to both sides of the poly element 14, symmetry is maintained. FIG. 2 illustrates leakage and performance curves for devices which incorporate channel length scaling of 17%.

It is more difficult to achieve channel length scaling for 45 nm digital libraries than for 65 nm digital libraries. FIG. 3 illustrates an attempt to use the channel length scaling method described above, in connection with a 45 nm digital library cell. The 45 nm digital library cell 30 includes a poly element 32 and two contact elements 34. Channel length scaling is achieved by providing 5 nm of additional poly elements 36 to both sides of the poly element 32, thereby increasing the size of the poly by 10 nm. This increase results is channel length scaling of 25%. By providing additional poly elements 36 on both sides of the poly element 32, symmetry is again maintained within the cell, however, a 25% channel length scale is too aggressive to be useful, would not be acceptable from a performance standpoint, and would not be competitive with the rest of the industry.

Channel length scaling in excess of 10% may lead to unwanted threshold voltage mismatch. This large shift in the threshold voltage is due to the threshold roll up/off curve. Large channel length scaling may result in additional stress induced mobility/performance variation due to contact to poly spacing.

The positioning of contacts impacts channel stress. While positioning contacts relatively close to a channel results in low stress at the channel, positioning contacts further from a channel results in greater stress within the channel.

As contact-to-poly spacing increases, the longitudinal stress generally remains constant until the contact-to-poly spacing reaches approximately 0.14 um. As contact-to-poly spacing increases, the vertical stress increases exponentially until the contact-to-poly spacing reaches approximately 0.14 um.

The force applied by the strain nitride film is proportional to the volume and proximity of the film to the channel. The film volume and proximity is modulated by the poly-to-poly distance; the contact dimension and contact-to-poly distances; and the contact pitch.

Due to the negative effects of large channel length scaling, an alternative method for channel length scaling is needed.

SUMMARY

An embodiment of the present invention provides an effective GDS-based channel length scaling method. A library cell is designed, and then the width of the polys is increased, and the polys and contacts are shifted in order to maintain poly-to-poly and contact-to-poly spacing. The method can be used in association with a 45 mat digital library cell. Specifically, a library cell having 40 nm polys is designed, and then the width of each of the polys is increased by 5 nm to 45 nm, and the polys and contacts are shifted in order to maintain poly-to-poly and contact-to-poly spacing. The poly lines and contacts can be shifted by starting at the center and going out radially, or by beginning at the perimeter and moving radially inward. The method can be used with any library cell design which is entirely GDS (graphic database system) based, including, for example, 32 nm library cell design.

BRIEF DESCRIPTION OF THE DRAWINGS

The organization and manner of the structure and operation of the invention, together with further objects and advantages thereof, may best be understood by reference to the following description, taken in connection with the accompanying drawings, wherein:

FIG. 7A illustrates the poly elements of the 40 nm library cell design of FIG. 6A;

FIG. 7B illustrates the poly elements of the 45 nm library cell design of FIG. 6B;

FIG. 9A illustrates the contact elements and poly elements of the 40 nm library cell design of FIG. 6A;

FIG. 9B illustrates the contact elements and poly elements of the 45 nm library cell design of FIG. 6B;

FIG. 10A illustrates the P-active and N-active perimeters of the 40 nm library cell design of FIG. 6A; and FIG. 10B illustrates the P-active and N-active perimeters of the 45 nm library cell design of FIG. 6B.

DETAILED DESCRIPTION OF A PREFERRED EMBODIMENT

Figure 1:
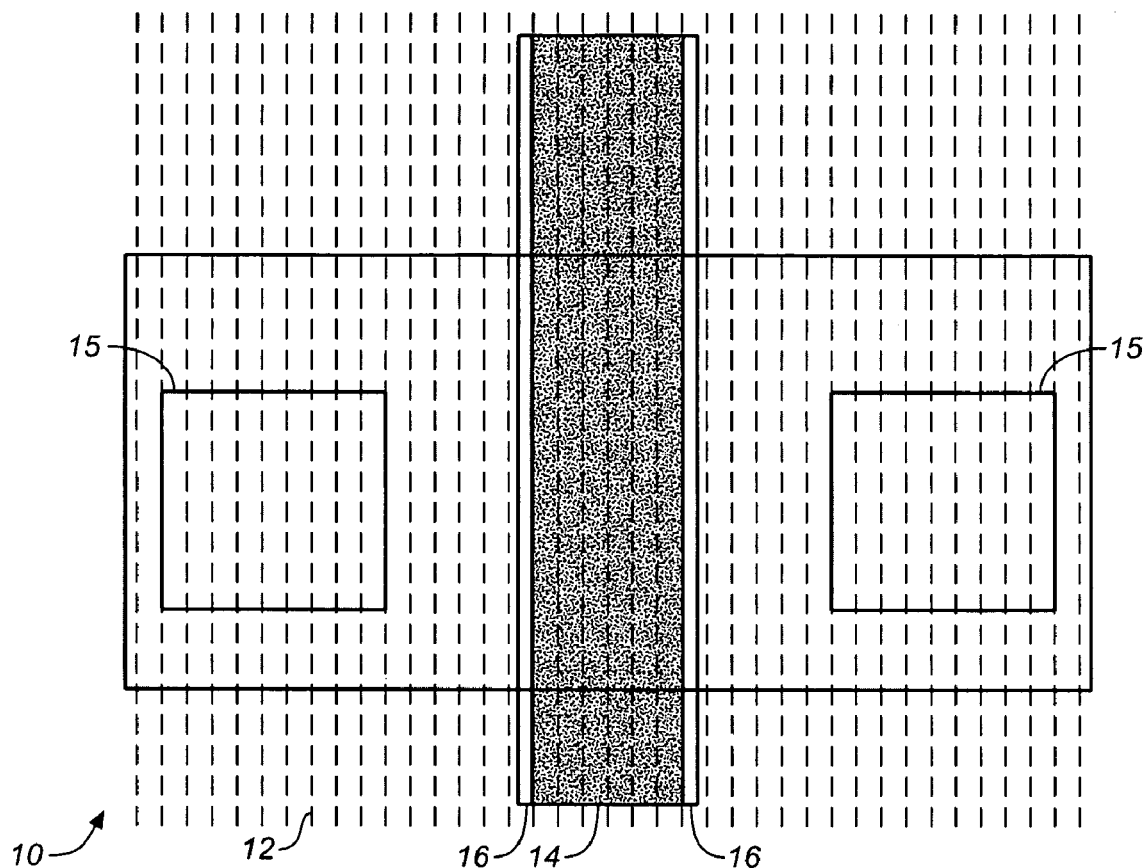
FIG. 1 illustrates a portion of a 65 nm digital library cell which provides channel length scaling by providing additional poly elements to both sides of the poly element.
Figure 2:
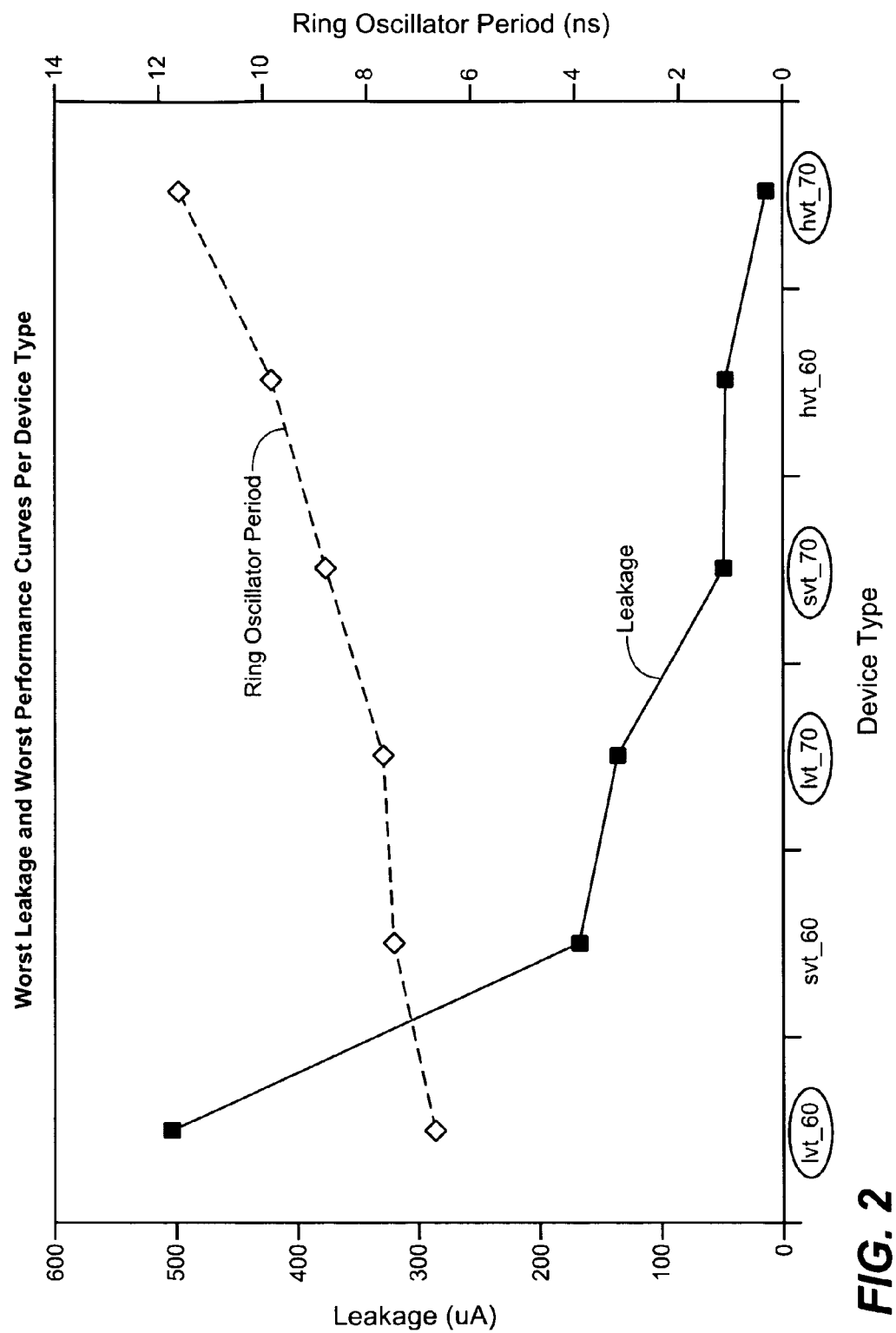
FIG. 2 is a graph which illustrates leakage and performance curves for devices which incorporate channel length scaling of 17%.
Figure 3:
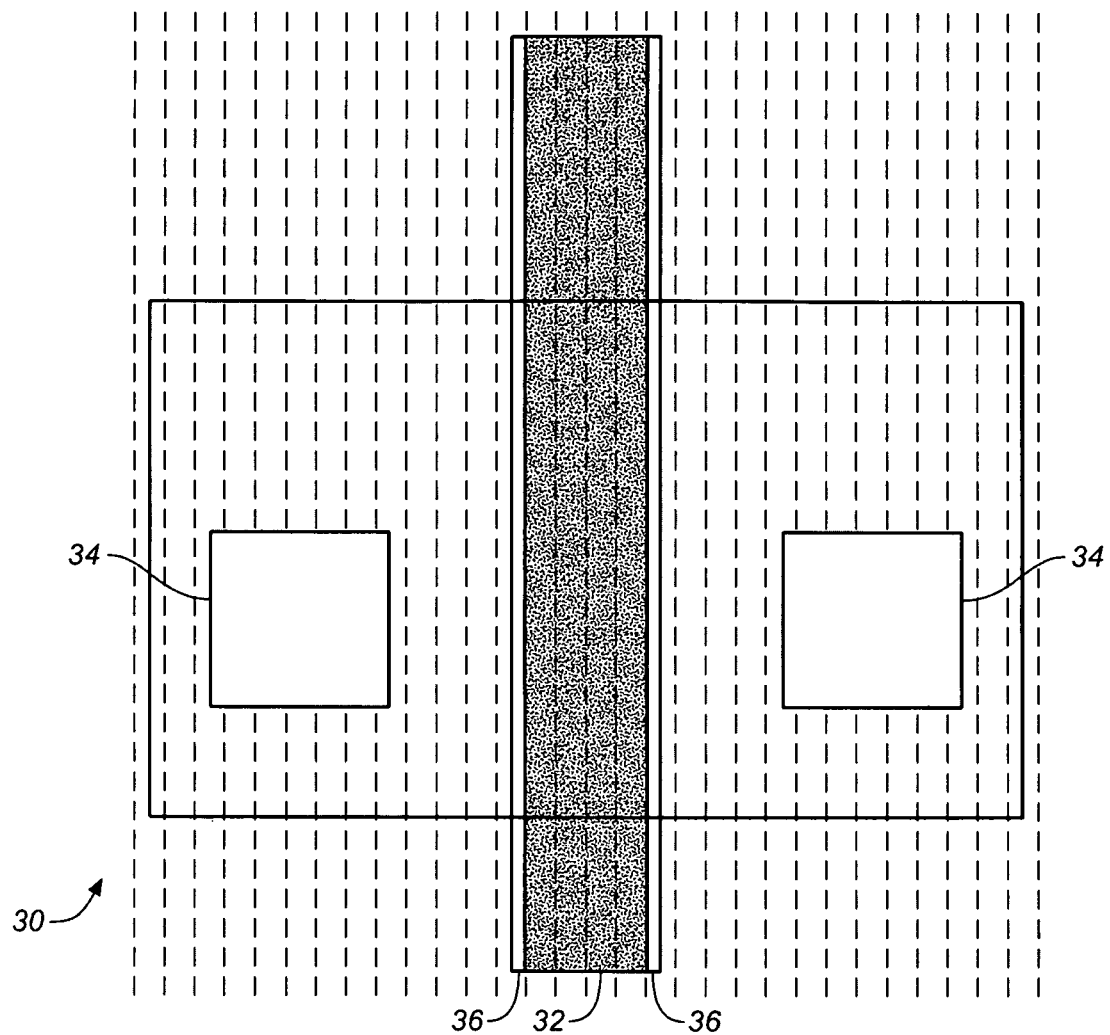
FIG. 3 illustrates a portion of a 45 nm digital library cell which provided channel length scaling by providing additional poly elements to both sides of the poly element.

While the invention may be susceptible to embodiment in different forms, there is shown in the drawings, and herein will be described in detail, a specific embodiment of the invention. The specific embodiment which is illustrated and described is to be considered an example of how the present invention can be employed, and is not intended to limit the present invention to that which is illustrated and described herein.

Figure 4:
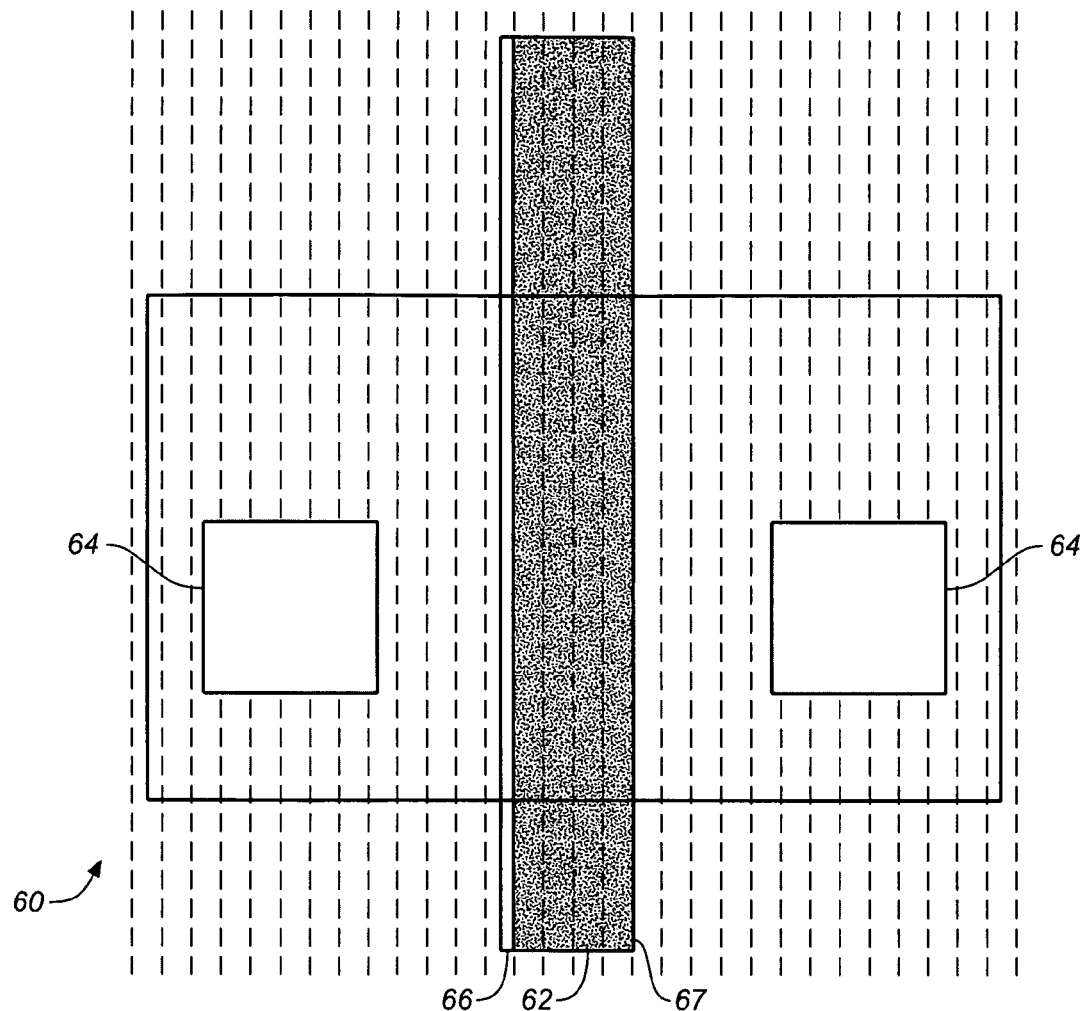
FIG. 4 illustrates a method of channel scaling for 45 nm digital library cells by providing additional poly elements to one side of the poly element.

An embodiment of the present invention provides a method of channel length scaling of 45 nm digital library cells. As shown in FIG. 4, the digital library cell 60 includes a poly element 62 and two contact elements 64. The length of the channel of the library cell is scaled by providing an additional poly element 66 on only one side of the poly element 62, rather than on both sides. This results in an increase in the width of the poly element from 40 nm to 45 nm. This increase of 5 nm, results in channel length scaling of 12.5% (100*((45−40)/40)). While channel length scaling of 12.5% is desirable, symmetry is not maintained within the cell because poly is added to only a single side of the poly element. In addition, the poly-to-poly spacing requirement is violated. Thus, placement of the contacts 64 and poly 62, 66 must be modified to avoid the negative impact on strain engineering. The asymmetry due to placement of the additional poly element 66 on only one side of the poly element 62 also potentially results in wasted space on the opposite side 67 of the poly element 62.

There is a negative impact of asymmetry which results from poly being added to only one side of a poly element. Specifically, there is process misalignment modeling wherein misalignment occurs, and there is an impact of contact misalignment on timing. As shown, asymmetry results in an increase in timing delays.

Figure 5A:
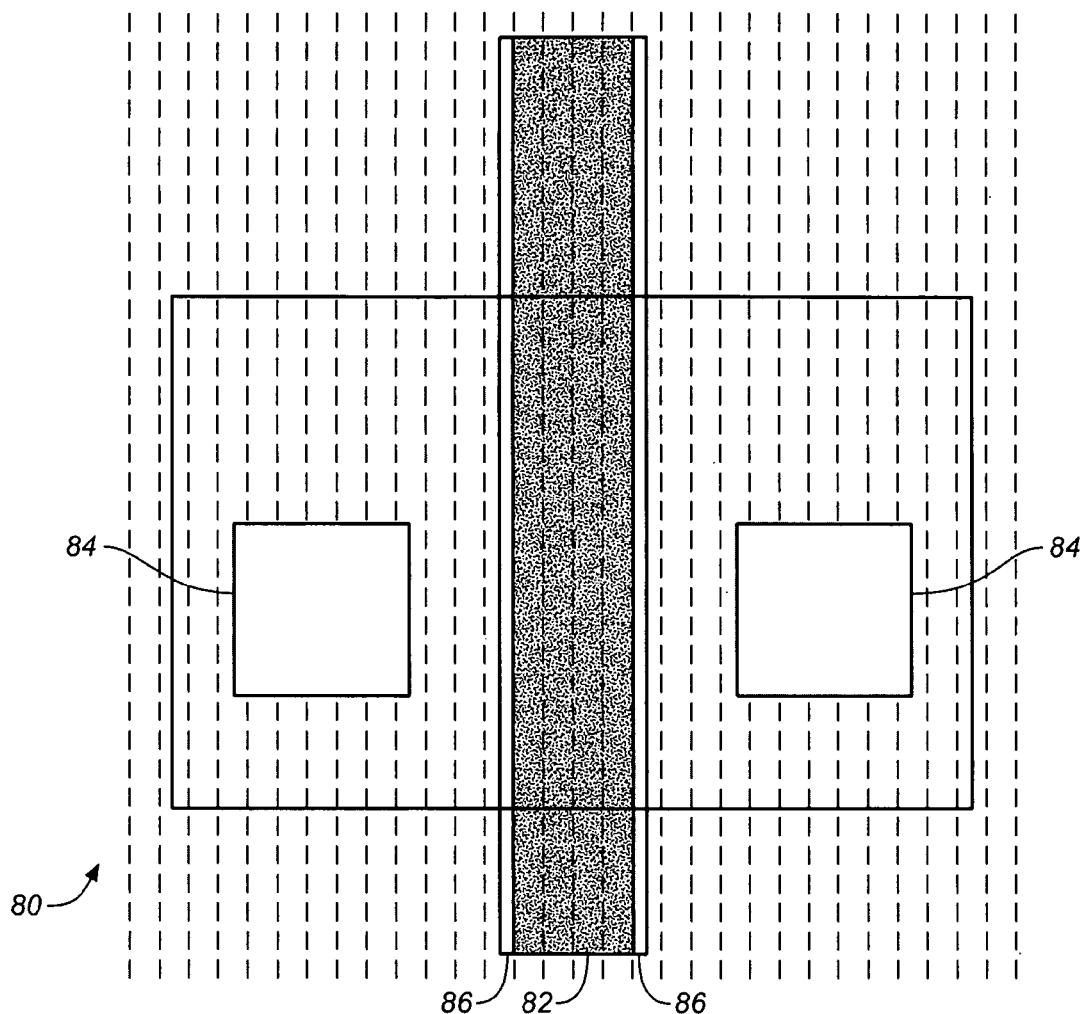
FIG. 5A illustrates a 45 nm digital library cell which has been channel length scaled on either side of the poly element at the OPC grid.
Figure 5B:
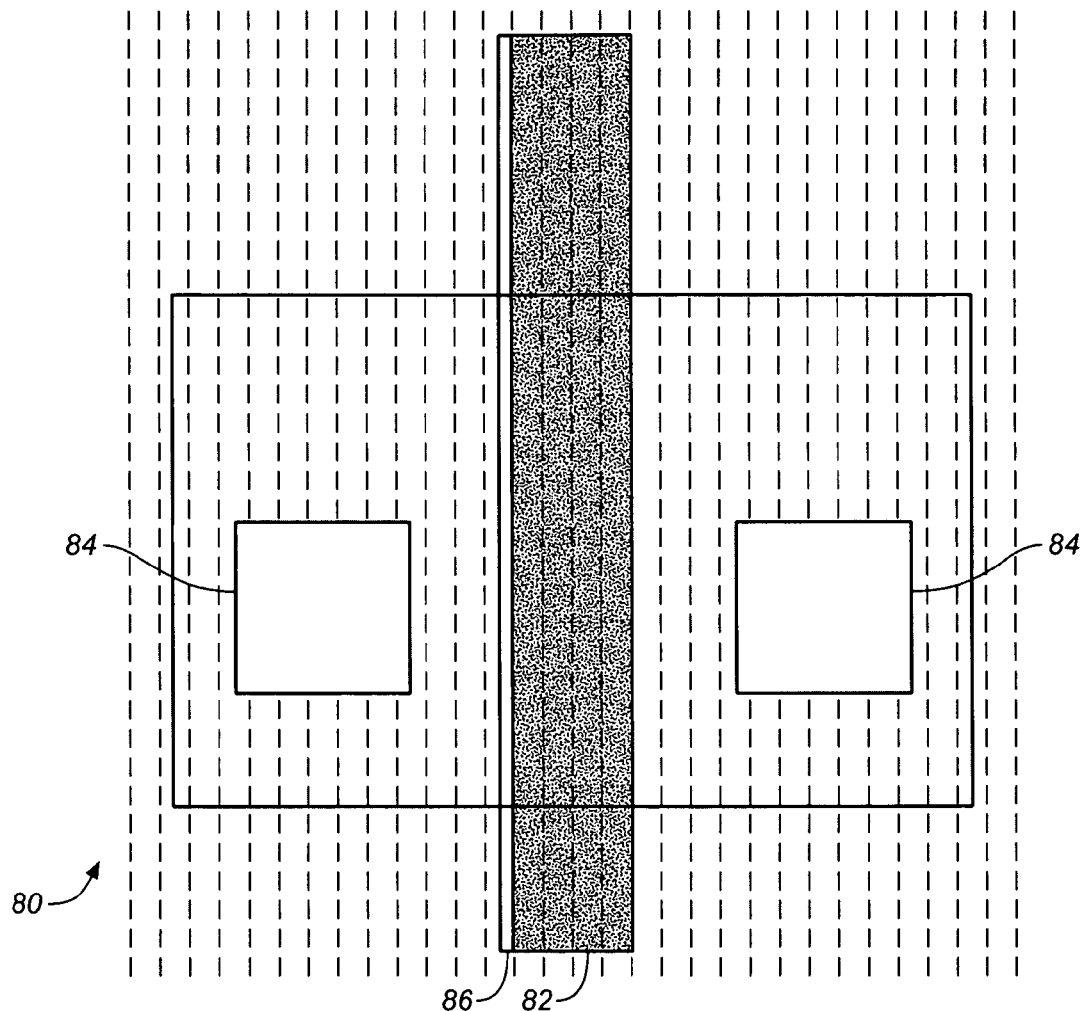
FIG. 5B illustrates a 45 nm digital library cell design which has been channel length on one side of the poly element at the OPC grid.

It is general practice within the industry to develop a process where the channel length scaling is performed on the optical proximity correction (OPC) mask data. Some foundries will increase the wafer cost in order to perform this process. FIGS. 5A-5B illustrate 40 nm drawn gate channel length scaling at the OPC. As shown in FIGS. 5A and 5B, the size of the OPC data 80 is 1 nm, which is ⅕ the size of the GDS grid size at poly. As illustrated in FIG. 5A, a 1 nm change 86 to each side of the poly element 82 results in a 5% channel length scale. A 2 nm change to each side of poly would result in a 10% channel length scale. A 3 nm change to each side of poly would result in a 15% channel length scale. Thus, a channel length scale as small as 5% can be achieved, while maintaining symmetry with the contacts 84. Additionally, as shown in FIG. 5B, a channel length scale of 2.5% can be achieved by adjusting only one side of the poly element 82. Slight asymmetry issues may, however, arise. As the contact to poly spacing decreases with the additional channel length scaling, the probability of a contact to poly short increases. Eventually the channel length scaling allowed is limited by yield loss. This mechanism ultimately limits the channel length scaling that can be done with an OPC based method.

For 45 nm digital library cells, discrete spacing between poly may be allowed. Optimal cell density is achieved when the minimum poly spacing is used. Based on current design rules, when poly spacing is provided as being a minimum, the contact-to-gate spacing will be at a minimum. However, the use of minimum poly to poly spacing and minimum contact-to-poly spacing, does not provide sufficient process margin for OPC based channel length scaling shown in FIGS. 5A and 5B. In addition, with the OPC method, as the poly spacing is modified, the CD control is more difficult. The needed channel length scaling and resulting poly space change may result in more CD variation than maintaining the original minimum allowed space. Thus, if it is determined that the minimum allowed poly to poly space is not able to be manufactured with the OPC based channel length scaling approach, then a larger allowed poly to poly space will need to be used, resulting in an unacceptable overall increase in library cell area and loss of cell density.

In addition, where OPC based channel length scaling is not currently in use, use of OPC based channel length scaling for 45 nm digital libraries will require many down stream flow changes in the design flow system to accommodate OPC based flow. For example, if commercially available place and route tools are currently in use, the transition to an OPC based system will require additional resources to support additional identification layers in order to identify which cells/devices need to be changed to longer channel lengths. Furthermore, synthesis tools, placement tools and characterization and timing engine tools will need to be integrated into the flow. Thus, transition to OPC based channel length scaling will result in complexity in tools and flow.

A method in accordance with an embodiment of the present invention begins by designing a library cell 100 having a 40 nm drawn gate. FIGS. 6A, 7A, 8A, 9A and 10A all relate to the library cell 100 which is initially designed. As shown, the library cell 100 includes poly elements 102, perimeter poly bars 104, metal 1 elements 106, an N-active (the outside diameter being identified with reference numeral 108), a P-active (the outside diameter being identified with reference numeral 110), a cell border 112, and contacts 114. Spacing between the poly elements 102, 104 is provided as being at a minimum.

Once the library cell 100 is designed, changes are made to the design to arrive at a re-designed library cell 140 that has a 45 nm drawn gate. The re-designed library cell 140 is shown in FIGS. 6B, 7B, 8B, 9B and 10B, and comparing each of these Figures to FIGS. 6A, 7A, 8A, 9A and 10A, respectively, illustrates the changes that are effected to the initial design.

While the re-designed library cell 140 provides a 45 nm drawn gate 102A rather than a 40 nm drawn gate 102 (such as is provided in the initial library cell 100), poly-to-poly spacing is maintained at being minimum, and symmetry with regard to contact-to-poly spacing is maintained (at minimum). To achieve this, the contacts are moved and the polys are shifted in the re-design, as will be described in more detail herein below.

Figure 6A:
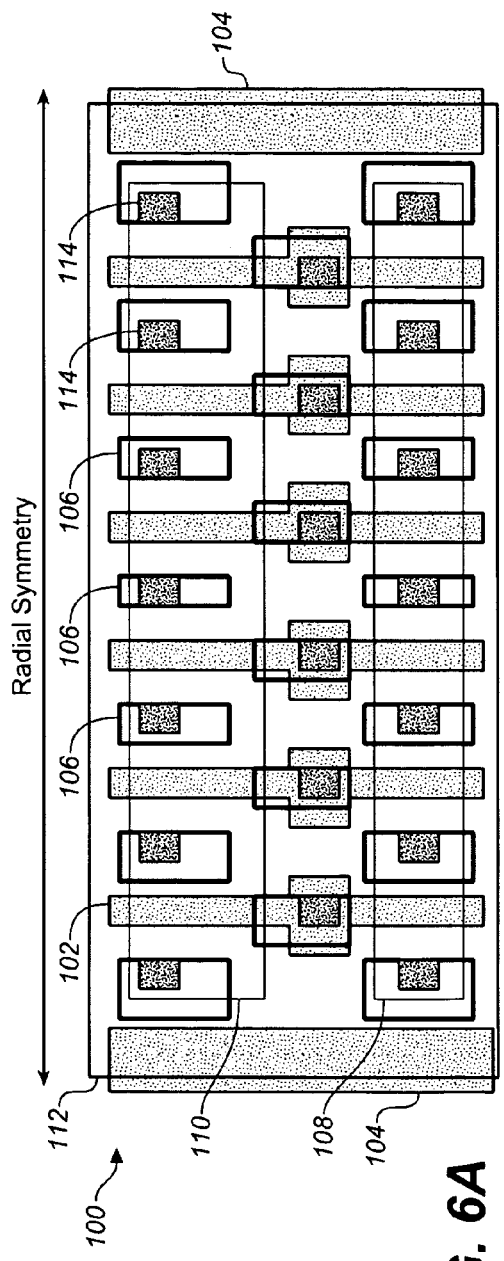
FIG. 6A illustrates an initial 40 nm library cell design.
Figure 6B:
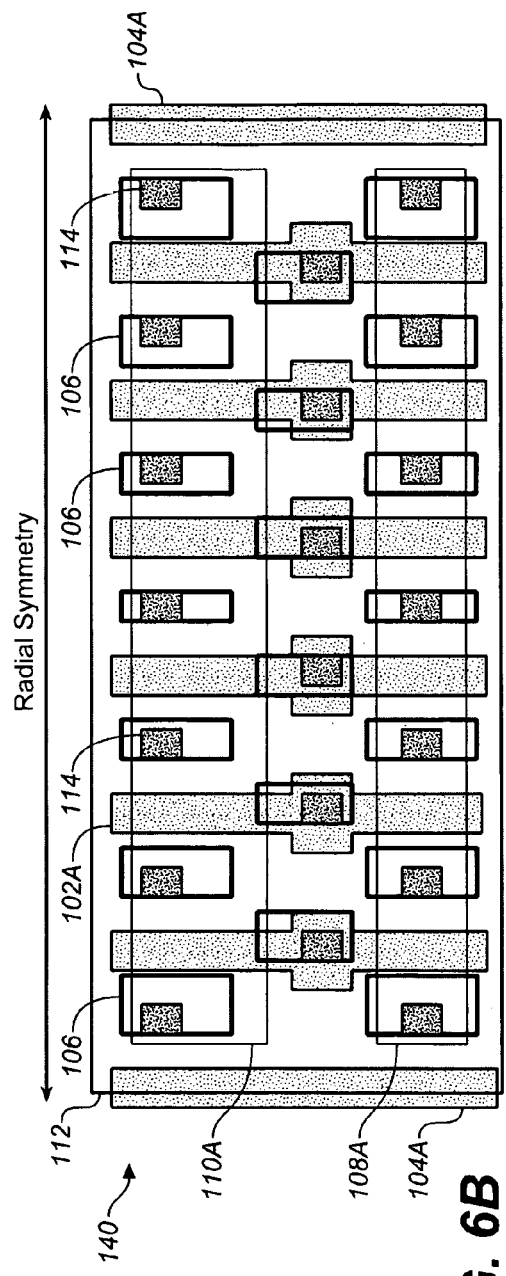
FIG. 6B illustrates a 45 nm library cell design which is in accordance with an embodiment of the present invention.

To re-design the library cell 100 to arrive at library cell 140, the channel lengths of the library cell 140 are scaled to provide 45 nm drawn gates 102A as illustrated in FIG. 6B (as opposed to the gates 102 being 40 nm as illustrated in FIG. 6A). Using the 45 nm library cell, a template is defined with the specific metal 1 pattern 106. This metal 1 pattern 106 remains fixed (i.e., it is the same with regard to the two library cells 100, 140, as shown by comparing FIGS. 8A and 8B).

Next, the poly and contact elements of the 40 nm library cell are adjusted to fit within the 45 nm library cell by simply shifting the poly and contact elements from the positions shown in FIG. 9A to the positions shown in FIG. 9B. Starting from the center of the cell 100 and moving radially in the horizontal direction, the width of each poly gate is increased by 5 nm (compare the width of poly gates 102A in the re-designed library cell 140 to the width of the poly gates 102 of the original library cell 100) and the rest of the poly gates and contacts are spread out by the same amount (compare the location of each of the poly gates 102A and contacts 114 in the re-designed library cell 140 to the location of each of the poly gates 102 and contacts 114 in the original library cell 100). The process is repeated for each successive poly gate until the outside edge of the cell is reached. In a 45 nm digital library cell design, this operation is limited to twenty poly legs or gates. When more than twenty poly legs or gates are to be adjusted, a poly over field spacer structure must be added and the process can then be repeated.

As illustrated in FIGS. 7A and 7B, the poly-to-poly spacing (identified with reference numeral 69) is maintained at minimum and the cell perimeter poly bars 104A are used to maintain the poly-to-poly space.

Figure 8A:
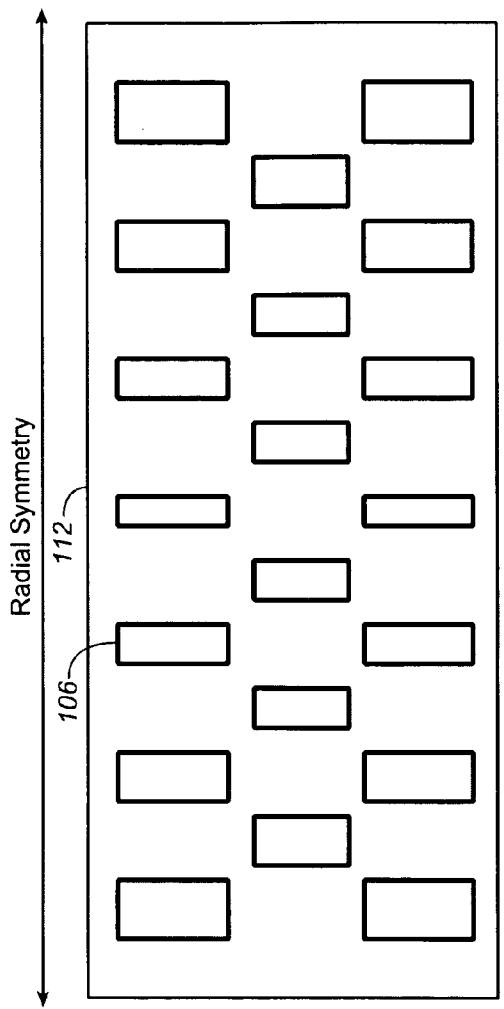
FIG. 8A illustrates the Metal 1 pattern of the 40 nm library cell design of FIG. 6A.
Figure 8B:
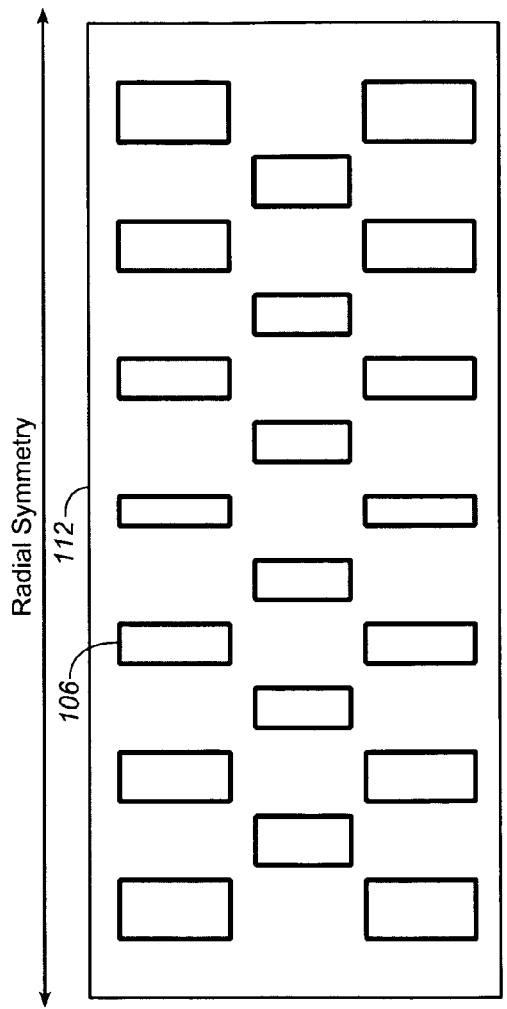
FIG. 8B illustrates the Metal 1 pattern of the 45 nm library cell design of FIG. 6B.

As illustrated in FIGS. 8A and 8B, the metal-1 patterns 106 and cell border 112 remain identical, and therefore compatibility of the cell level footprint is maintained.

As illustrated in FIGS. 9A and 9B, contact-to-poly spacing symmetry is provided and the contact-to-poly spacing (identified with reference numeral 71) at minimum space is maintained.

The method of channel length scaling of the present invention presents several advantages. Because the method of the present invention is fully GDS based, tool and flow complexity is reduced. Additionally, no significant flow or place and route tool changes are necessary relative to those required for 65 nm libraries, and no down-stream tool flow changes are necessary.

Because the metal-1 footprint is not altered, the channel length scaled chip provides compatibility for chip level placement and route tools. In addition, this GDS based approach to channel length scaling provides for interchangeability of the cells.

This channel length scaling approach results in a cell density penalty of only <<10% compared to changing to a non minimum allowed poly to poly space and using the OPC based method. The method of the present invention maintains poly-to-poly spacing at minimum. In the event it is determined that the OPC based approach to channel length scaling requires a non minimum poly-poly spacing rather than a minimum poly-to-poly spacing, the method of the present invention will provide a higher density, lower area and higher yielding channel length scaled library.

Another advantage is that better lithography based CD control is implemented resulting in reduced chip variability in cell performance.

Unlike the OPC based approach, the present invention does not impact strain engineering and carrier mobility due to contact-to-gate space variation. In addition, performance variation due to contact placement and misalignment induced mobility and IS DAT change is reduced. The contact to poly short related yield loss will be lower than an OPC based approach. Larger channel length scaling may be allowed in the present invention than allowed with an OPC based approach.

The present invention also provides for dynamic and static power reduction.

Finally, use of the GDS (graphic database system) based channel length scaling avoids the need to work with the foundry and 3.sup.rd party OPC based tool vendors, pay additional royalties and additional wafer cost in connection with an OPC based solution.

Although the method of the present invention has been described as including the step of adjusting the poly lines and contacts by starting at the center and going out radially, the adjustment can also be made by beginning at the perimeter and moving radially inward. Although the invention has been described by utilizing a poly spacing of minimum allowed based on the technology, any acceptable poly-to-poly spacing can be used. It should be noted, however, that a cell density penalty is provided with larger poly-to-poly spacing. Larger poly-to-poly spacing will allow for fewer legs to be used in the base cell before a poly spacer is needed to maintain the metal 1 footprint compatible layout for the cell. For example, a non minimum poly-to-poly space will allow for a base cell with twenty legs or gates, however, a minimum allowed poly-to-poly spacing will allow for a base cell with 28 legs or gates. Although the invention has been described in connection with 45 nm library cell design, it is to be understood that the method of the present invention can be used with any library cell design which is entirely GDS (graphic database system) based, including, for example, 32 nm library cell design.

While embodiments of the present invention are shown and described, it is envisioned that those skilled in the art may devise various modifications to the embodiment without departing from the spirit and scope of the present invention.

What is claimed is:

1. A GDS-based method of channel length scaling in library cell design, said GDS-based method comprising: using a GDS-based tool to design a library cell having a plurality of polys (polysilicon) and a plurality of contacts, wherein each of the polys are spaced away from each other, and wherein each of the contacts and polys are spaced away from each other; using the GDS-based tool to modify the library cell by increasing the width of the polys and using the GDS-based tool to shift the polys and the contacts such that poly-to-poly spacing is maintained and contact-to-poly spacing is maintained, wherein the step of shifting the polys and the contacts comprises at least one of; starting at a center of the polys and going out radially; and starting at a perimeter of the polys and moving radially inward.

2. The method as recited in claim 1, wherein the step of increasing the width of the polys comprises increasing the width by 5 nm.

3. The method as recited in claim 1, wherein the step of increasing the width of the polys comprises increasing the width from 40 nm to 45 nm.

4. The method as recited in claim 1, wherein the step of shifting the polys and the contacts such that poly-to-poly spacing is maintained comprises maintaining the spacing between the polys at minimum allowed space.

5. The method as recited in claim 1, wherein the step of shifting the polys and the contacts such that contact-to-poly spacing is maintained comprises maintaining the spacing between the contacts and polys at minimum allowed space.

6. The method as recited in claim 1, wherein the step of shifting the polys and the contacts such that poly-to-poly spacing is maintained comprises maintaining the spacing between the polys at minimum and maintaining the spacing between the contacts and polys at minimum.

7. The method as recited in claim 1, wherein the step of designing a library cell comprises designing a library cell which comprises metal-1 patterns, and the method comprises maintaining, and not changing, the metal-1 patterns.

8. The method as recited in claim 1, wherein the step of designing a library cell comprises designing a library cell which comprises an N-active and P-active sources and drains, and the method further comprises changing areas of the N-active and the P-active sources and drains.

9. The method as recited in claim 1, wherein the step of designing a library cell comprises designing a library cell which comprises metal-1 patterns, an N-active and P-active, and the method comprises maintaining, and not changing, the metal-1 patterns, and the method comprises changing the areas of the N-active and the P-active sources and drains.

* * * * *